United States Patent
Liu

(10) Patent No.: US 6,232,632 B1
(45) Date of Patent: May 15, 2001

(54) DOUBLE DENSITY NON-VOLATILE MEMORY CELLS

(75) Inventor: Yowjuang W. Liu, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/436,503

(22) Filed: Nov. 9, 1999

Related U.S. Application Data

(63) Continuation of application No. 09/110,446, filed on Jul. 7, 1998, now Pat. No. 6,118,147.

(51) Int. Cl.[7] .................................................. H01L 29/788
(52) U.S. Cl. .......................................... 257/315; 257/316
(58) Field of Search .................................. 257/314–324; 438/257–265

(56) References Cited

U.S. PATENT DOCUMENTS

| | | |
|---|---|---|
| 4,868,619 | 9/1989 | Mukherjee . |
| 5,049,956 | 9/1991 | Yoshida et al. . |
| 5,053,839 | 10/1991 | Esquivel et al. . |
| 5,338,953 | 8/1994 | Wake . |
| 5,386,132 | 1/1995 | Wong . |
| 5,936,274 * | 8/1999 | Forbes et al. ............................ 257/315 |
| 5,945,708 * | 8/1999 | Tihanyi ................................... 257/331 |
| 6,020,227 * | 2/2000 | Bulucea .................................. 438/275 |
| 6,022,779 * | 2/2000 | Shin et al. ................................ 438/63 |
| 6,093,606 * | 7/2000 | Lin et al. ................................ 438/259 |
| 6,124,168 * | 9/2000 | Ong ........................................ 438/259 |

* cited by examiner

Primary Examiner—Tom Thomas
Assistant Examiner—Cuong Q. Nguyen

(57) ABSTRACT

Double density non-volatile memory cells having a trench structure are formed in a substrate, thereby facilitating miniaturization, improved planarization and low power programming and erasing. Each double density cell comprises two floating gates and a common control gate. Each pair of double density cells shares a common source region. Embodiments include forming first and second trenches in a substrate and depositing a tunnel dielectric layer in each trench. Polycrystalline silicon is then deposited filling each trench and a hole is etched forming two floating gate electrodes in each trench. An interpoly dielectric layer is then formed and a substantially T-shaped control gate electrode is deposited filling the hole between the floating gates and extending on the substrate.

5 Claims, 4 Drawing Sheets

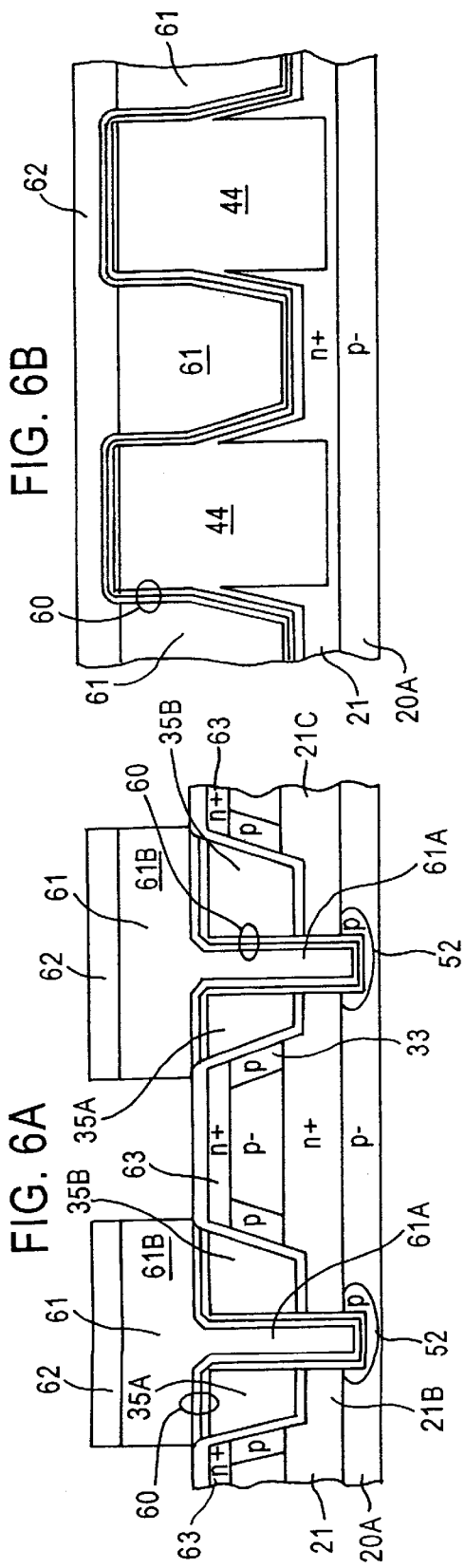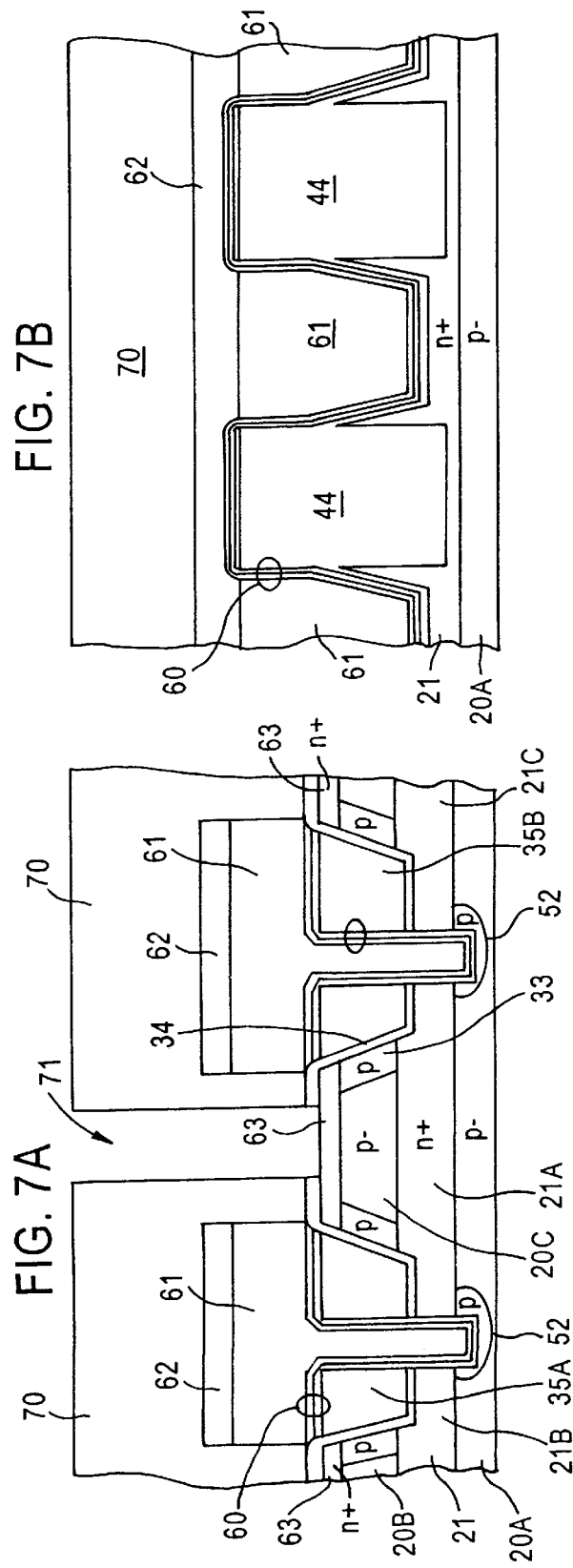

DOUBLE DENSITY NON-VOLATILE MEMORY CELLS

This application is a continuation of application Ser. No. 09/110,446 filed Jul. 7, 1998 now U.S. Pat. No. 6,118,147.

TECHNICAL FIELD

The present invention relates to a semiconductor device containing non-volatile memory cells and to a method of making such a semiconductor device. The present invention has particular applicability in manufacturing ultra large scale integration and high density non-volatile semiconductor devices with deep sub micron features and active regions isolated by insulated trenches.

BACKGROUND ART

Conventional non-volatile semiconductor devices include various types of flash memory devices, electrically programmable read only memory (EPROM) devices and electrically erasable programmable read only memory (EEPROM) devices. Such conventional types of memory devices are generally characterized by a floating gate and an electrical connection called a control gate, typically fabricated from polycrystalline silicon doped with an appropriate doping material to render the polycrystalline conductive, e., phosphorous. The floating gate is separated from a substrate region by a gate dielectric or tunnel dielectric layer of insulating material while the substrate region includes symmetrical or asymmetrical source/drain regions defining a channel region therebetween. The floating gate and control gate are typically separated by a layer of insulating material characterized as an interpoly dielectric layer.

EEPROMs are typically programmed by applying a voltage to the control gate so that electrons or a charge tunnel through the tunnel oxide layer and is stored on the floating gate in a capacitive manner. Erasing is implemented by grounding the control gate and causing electrons or charge to tunnel through the tunnel dielectric layer to the substrate. Typically, electrons tunnel through the tunnel dielectric layer by a phenomenon called "Fowler-Nordheim" tunneling. A conventional EEPROM is disclosed by Mukherjee et al., U.S. Pat. No. 4,868,619 and comprises an asymmetrical drain-source junction.

The escalating demands for high density and performance associated with ultra large scale integration semiconductor devices requires design rules of 0.18 microns and under, increased transistor and circuit speeds, sharp junctions, high reliability and increased manufacturing throughput for competitiveness. The reduction of design rules to 0.18 microns and under generates numerous problems challenging the limitations of conventional semiconductor technology.

Non-volatile memory cells occupy a significant amount of precious real estate on a semiconductor substrate and, hence, pose a serious impediment to miniaturization. Moreover, the protrusion of the gate electrodes above the main surface of a substrate results in the formation of a significant step portion which is difficult to planarize, thereby challenging the depth of focus limitations of conventional photolithographic techniques.

In copending U.S. patent application Ser. No. 08/882,961 filed on Dec. 18, 1997 and in copending application Ser. No. 08/993,890 filed on Dec. 18, 1997, semiconductor devices are disclosed comprising dual non-volatile memory cells, each comprising a substantially U-shaped floating gate electrode in a trench formed in the semiconductor substrate and a substantially T-shaped control gate electrode filling the trench and extending on the substrate.

In copending U.S. patent application Ser. No. 09/026,358 filed on Feb. 19, 1998, a semiconductor device containing double density non-volatile memory cells is disclosed, wherein each double density non-volatile memory cell contains a floating gate within a trench formed in a substrate and a control gate formed thereon.

There exists a continuing need for semiconductor devices with increased density and highly reliable deep sub-micron features. There exists a particularly need for reliable semiconductor devices containing dense non-volatile memory cells with increased channel lengths.

DISCLOSURE OF THE INVENTION

An advantage of the present invention is a non-volatile semiconductor device having improved device scalability, reduced complexity and low power programming and erasing.

Another advantage of the present invention is a method of manufacturing a non-volatile semiconductor device having improved device scalability, reduced complexity and low power programming and erasing.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device comprising: a substrate; and first and second spaced apart double non-volatile memory cells, each double non-volatile memory cell comprising first and second floating gate electrodes spaced apart from a common control gate electrode by a dielectric layer.

Another advantage of the present invention is a semiconductor device comprising: a substrate having a main surface; and first and second spaced apart double non-volatile memory cells, each memory cell comprising: a trench extending from the main surface into a common source region; a tunnel oxide layer lining the trench; first and second floating gates within the trench; and a common control gate electrode comprising a first section extending through each trench between the first and second floating gate electrodes with a dielectric layer therebetween, the first section having a bottom surface terminating below the common source region, and a second section integral with the first section, extending substantially laterally on the upper surface of the first and second floating gates with the dielectric layer therebetween.

Another advantage of the present invention is a method of manufacturing a semiconductor device, the method comprising forming first and second spaced apart double non-volatile memory cells, a portion of each of which extends into a substrate, each double non-volatile memory cell comprising first and second floating gate electrodes spaced apart from a common control gate by a dielectric layer.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF DRAWINGS

FIGS. 2A–7B illustrate sequential phases of an embodiment in accordance with the present invention.

DESCRIPTION OF THE INVENTION

Figure 1:
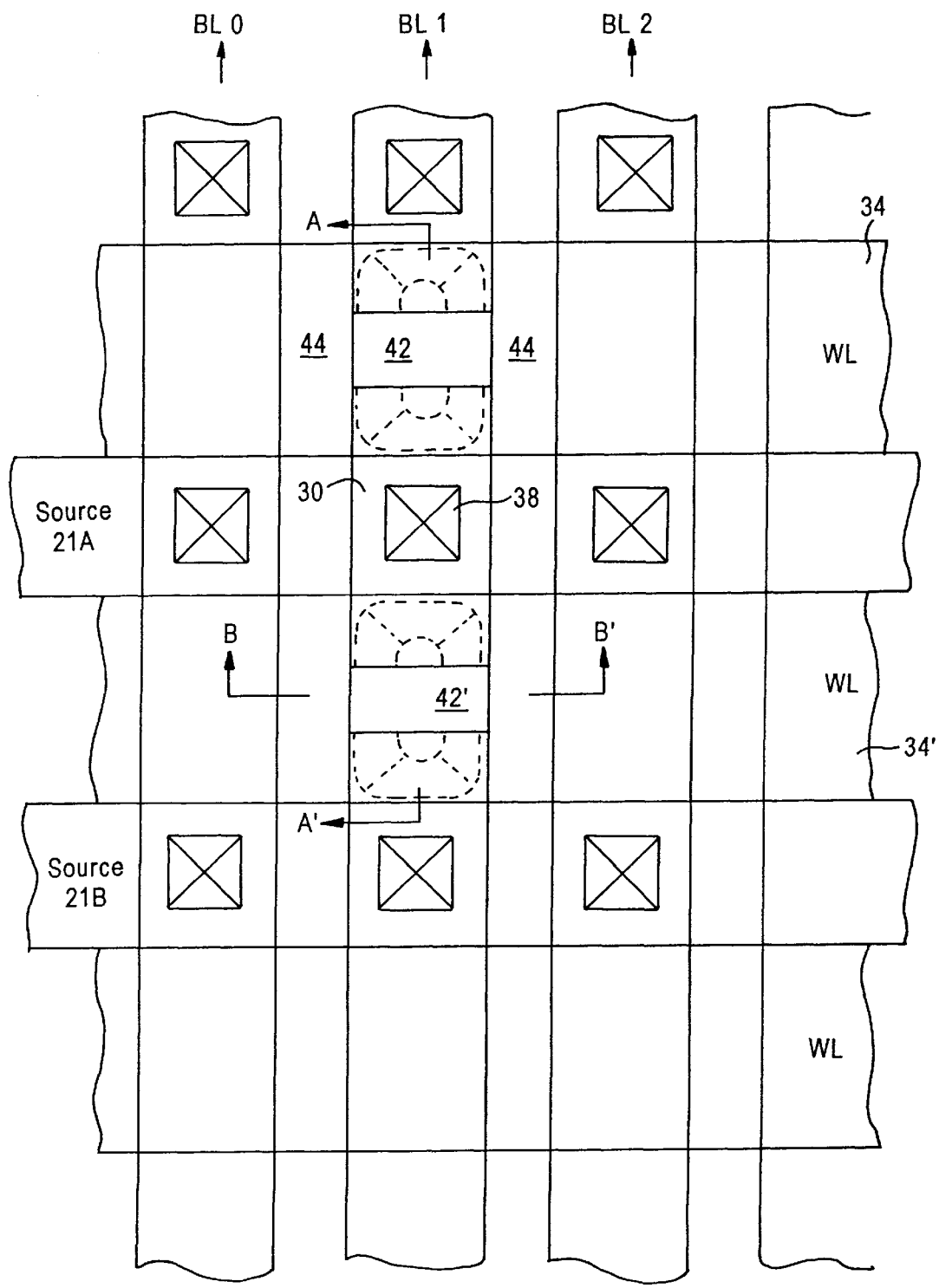
FIG. 1 schematically illustrates a plan view of an embodiment of the present invention.
Figure 2A:
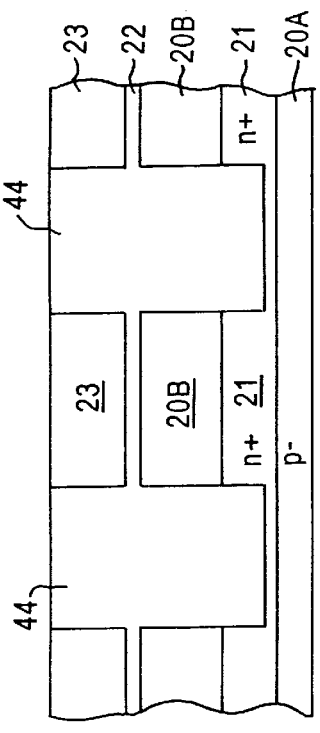
Figure 2B:
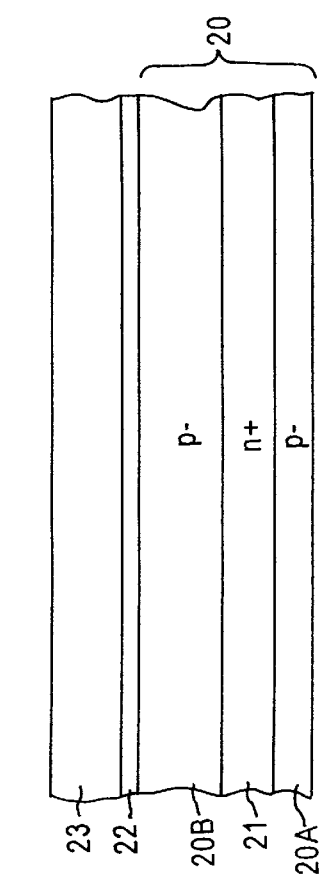

The present invention addresses and provides an efficient solution to problems generated by the ever increasing demands for high integration and reduced feature sizes into the deep sub-micron range by forming double density non-volatile memory cells, e.g. an array of four non-volatile memory cells comprising two double density non-volatile memory cells formed in a semiconductive substrate. Advantageously, each double density non-volatile memory cell comprises first and second floating gate electrodes spaced apart from a common control gate electrode by a dielectric layer. Also, advantageously, the double density cell pairs share a common source region, thereby reducing the area of the source region and improving erase efficiency. Another technological advantage of the present invention is the formation of a floating substrate between the pair of double non-volatile memory cells, thereby deriving the benefits of a silicon on insulator (SOI) structure without encountering the defects generated by conventional SOI methodology. Significantly, the channel length is controlled by the etching depth into the substrate, thereby decoupling the channel length from the limitations of conventional photolithographic techniques. Moreover, the present invention enables the technological advantage of increasing the channel length without consuming precious chip real estate. The present invention also achieves the technological advantage of forming an array of four non-volatile memory cells by reducing the number of word lines from four to two, thereby simplifying the memory cell array. The present invention also achieves additional technological advantages, such as high floating gate coupling ratios for enhanced device performance, and larger tunneling areas for Fowler-Nordheim programming. The inventive semiconductor devices require low power for programming and erasing with an attendant increase in efficiency, are capable of enhanced bulk erasing via the corners as in a DINOR operation, and exhibit low source/drain resistance. The present invention is compatible with conventional processing equipment and achieves a significantly increased denser layout when employed with shallow trench isolation technology. The present invention is applicable to various conventional circuits, exhibits high operating speeds, improved reliability, accuracy and efficiency, a high signal-to-noise ratio, and superior process control at a reduced manufacturing cost.

In accordance with the present invention, first and second spaced apart double density non-volatile memory cells are formed, each double density non-volatile memory cell comprising first and second floating gate electrodes spaced apart from a control gate electrode by a dielectric layer. Initially, a substrate is provided. As used throughout this application, the term "substrate" denotes a semiconductor substrate, an epitaxial layer formed on a semiconductor substrate, a well region formed in a semiconductor substrate, or a layer of semiconductor material, e.g., doped monocrystalline silicon, on another material, e.g., glass, ceramic, glass-ceramic, or plastic. An active region on the main surface of the semiconductor substrate is isolated by forming trenches and filling the trenches with dielectric material, as by employing conventional trench isolation methodology. Trenches are than formed in the active region. For example, a pair of first and second trenches are formed in the main surface of the semiconductor substrate spaced apart by a mesa type region. Each trench extends into and has a bottom portion terminating in the source region. A double density non-volatile memory cell pair is then formed in each trench by depositing polycrystalline silicon therein and forming a hole through the polycrystalline silicon below the source region, thereby forming two floating gate electrodes. The hole accommodates a first section of a common control gate electrode spaced apart from the floating gates by an interpoly dielectric layer. A second section of the common control gate, formed integrally with the first portion, extends on the upper surface of the control gates.

Embodiments of the present invention include forming the trenches for accommodating the double density non-volatile memory cell pairs by masking and etching techniques employed in conventional trench isolation methodology. Embodiments of the present invention also comprise etching to form the trench at an acute angle with respect to the main surface of the semiconductor substrate forming a substantially inverted trapezoidal opening, such as that formed in copending U.S. patent application Ser. No. 09/026,358. Such a trench opening can be formed by any of various techniques, as by controlling the silicon etch by adjusting the pressure and etch bias voltage during etching. The sloped trenched can also be formed by ensuring that the upper surface of the semiconductor substrate exhibits a (100) crystallographic orientation and employing an orientation-dependent etch, as in copending application Ser. No. 09/026,358.

A schematic plan view of an embodiment of the present invention is illustrated in FIG. 1, wherein first 42 and second 42' double density non-volatile memory cell pairs are isolated by trench isolation 44,44, and share a common source region 21A, employing two word lines 34,34'. Bit line contact 38 extends to a drain region between the double density non-volatile memory cell pairs.

An embodiment of the inventive methodology in accordance with the present invention is schematically illustrated in FIGS. 1A–7B, wherein similar reference numerals denote similar elements. FIGS. 2A, 3A, 4A, 5A, 6A and 7A are taken along line A–A' of FIG. 1: while FIGS. 2B, 3B, 4B, 5B, 6B and 7B are taken along line B–B' of FIG. 1. Adverting to FIGS. 2A and 2B, a substrate 20 is provided, e.g., monocrystalline silicon doped with a p-type impurity, such as boron, at a $p^-$ impurity concentration, e.g. $1\times10^{15}$ atoms$^{-3}$. Ion implantation is then conducted by implanting an n-type impurity to form a relatively deep and high energy implant layer 21 having an $n^+$ impurity concentration which forms a source layer in which source regions are formed. Such impurity implantation can advantageously be conducted by implanting arsenic and phosphorous atoms to form a graded profile. Typical implantation conditions include implanting an n type impurity at an implantation dosage of about $1\times10^{14}$ to about $1\times16^{16}$ atoms cm$^{-2}$, e.g. about $1\times10^{15}$ atoms cm$^{-2}$, at an implantation energy of about 200 to about 300 KeV. After diffusion annealing, the heavily doped source layer 21 extends on bottom portion 20A of substrate 20 with the remaining portion 20B of substrate 20 on source layer 21.

An oxide layer 22 is then formed, as by thermal oxidation, on the main surface of substrate 20. A hard mask 23, such as silicon nitride, is then deposited on oxide layer 22. Adverting to FIG. 2B, nitride layer 23 is patterned to form an isolation trench mask and isolation trenches are formed in the substrate extending into source layer 21. For example, the isolation trenches can extend into source layer 21 to a depth of about ½ the thickness of source layer 21. The isolation trenches are formed and then filled with dielectric material 44, e.g. silicon oxide, in a conventional manner consistent with conventional trench isolation formation methodology. Planarization can then be implemented, as by chemical mechanical polishing (CMP). Such trench isolation laterally isolates two of the double density non-volatile memory cells for a total of four memory cells of an array. Alternatively, inter device isolation can be implemented by a localized oxidation of silicon (LOCOS). The LOCOS oxidation step can also be preceded by a p-type channel stop implantation which would extend from the bottom of the LOCOS isolation into the $n^+$ doped region 21 (the source layer).

Nitride layer 23 is further patterned and etched to define windows. Adverting to FIG. 3A, etching is then conducted to form trenches which extend into the source layer 21 but not to a greater depth than the isolation trench. Trench 31 can be formed in the substrate in a conventional manner, e.g., employing conventional trench isolation methodology. Each trench 31 formed in the substrate comprises side surfaces, each side surface having one end intersecting the main surface at an edge and another end extending into the substrate. The side surfaces of each trench 31 extending into the substrate are connected by a bottom surface forming corners. Trenches 31 formed in the substrate can be U shaped or inverse trapezoidal shaped with the side surfaces extending into the substrate at an acute angle with respect to the main surface of the substrate. This can be implemented in a conventional manner, as by adjusting the voltage bias during etching. For example, as the voltage bias is increased, etching is substantially isotropic; whereas as the voltage bias decreases, tapering occurs as etching tends to become more anisotropic. Trench formation results in the formation of a mesa region 32 between trenches 31. Embodiments of the present invention include forming trenches having rounded corners to avoid the generation of high electrical fields due to stresses at sharp trench corners. Embodiments of the present invention include rounding the trench corners by forming a sacrificial oxide layer after forming the trench and removing the sacrificial oxide layer, resulting in rounding of the trench corners in the substrate.

P-type impurities, are then ion implanted, as by rotational angular ion implantation, to form channel regions 33 having a (p) impurity concentration greater than that ($p^-$) of substrate 20. The channel regions are formed along the side surfaces of the trenches 31 and, hence, along the side surfaces of the mesa region 32. Ion implantation to form the channel regions can be conducted at an implantation dosage of about $1\times10^{12}$ to about $1\times10^{14}$ atoms $cm^{-2}$, e.g. about $1\times10^{13}$ atoms $cm^{-2}$, at an implantation energy of about 0.1 to about 30 KeV. Typically. the channel region can be formed at a length of about 0.1 microns.

A tunnel dielectric layer 34 is then formed lining each trench and extending on the main surface of the substrate. Embodiments of the present invention include forming a tunnel dielectric layer having a thickness less than about 100 A, e.g., about 20 A to about 100 Å. The tunnel dielectric layer can comprise any of various dielectric materials typically employed in conventional EEPROMs as a tunnel dielectric layer, e.g., a nitrided silicon oxide which can be formed by thermal oxidation or chemical vapor deposition followed by nitrogen ion implantation or rapid thermal annealing in a nitrogen environment. Embodiments also include forming the tunnel dielectric layer by depositing silicon nitride, silicon oxynitride, a nitride oxide-nitride composite or an oxide-nitride-oxide composite.

Figure 3A:
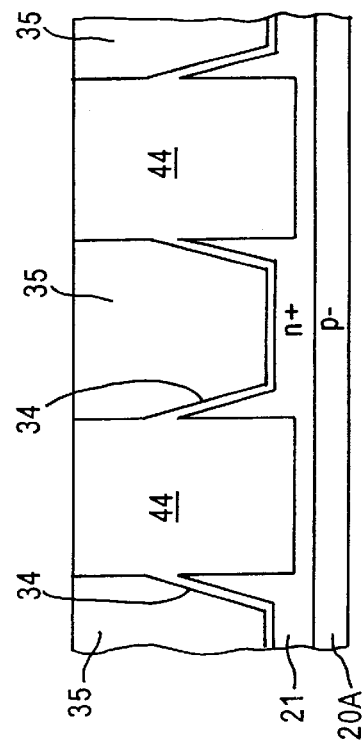
Figure 3B:
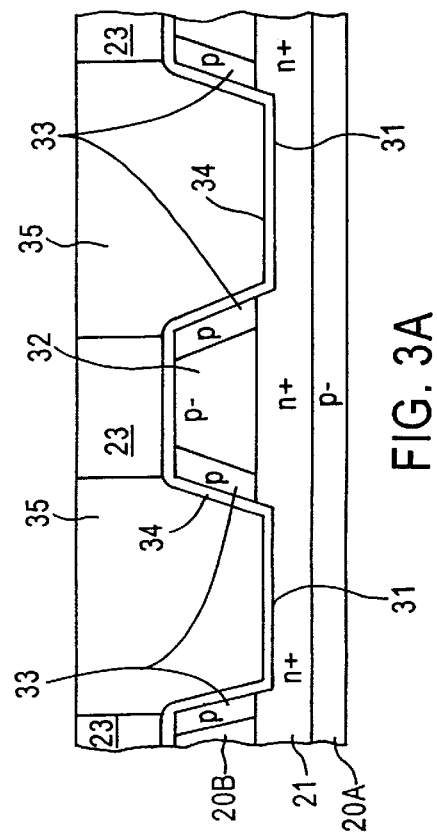

A first layer of conductive material 35, e.g. doped polycrystalline silicon (poly I), is deposited to fill trenches 31 followed by CMP, such that an upper surface of the deposited poly I 35 is substantially coplanar with the upper surface of silicon nitride mask 23, as illustrated in FIG. 3A. The corresponding structure viewed along line B–B' of FIG. 1 is illustrated in FIG. 3B.

Figure 4B:
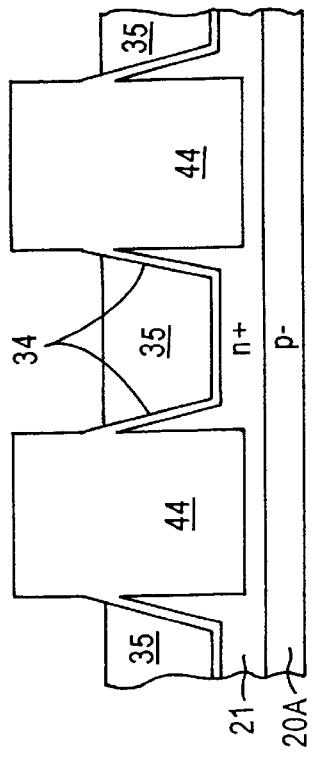
Figure 4A:
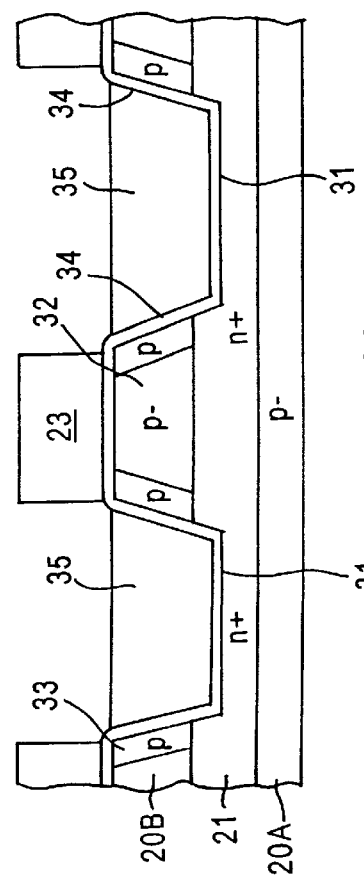

Adverting to FIG. 4A, poly I 35 is etched back, as by anisotropic etching, such that its upper surface is substantially coplanar with the main surface of the substrate. The corresponding structure when viewed long line B–B' of FIG. 1 is depicted in FIG. 4B.

Figure 5B:
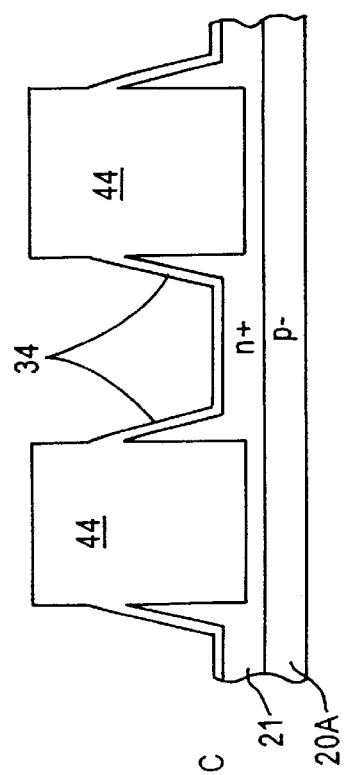
Figure 5A:
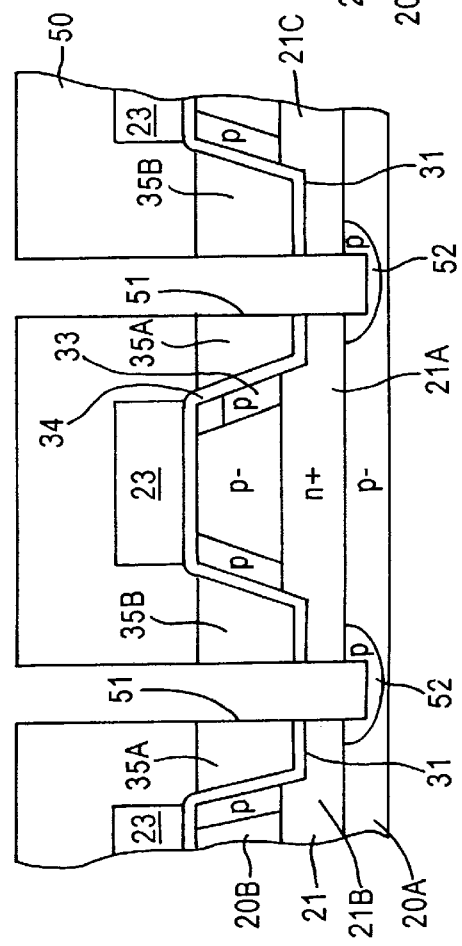

Adverting to FIG. 5A, a resist mask 50, e.g,. a conventional photoresist mask, is formed and etching is conducted to form hole 51 through poly I 35 in each trench 31, thereby generating first 35A and second 35B floating gate electrodes in each trench 31. The bottom of each hole 51 terminates under source layer 21 in the first impurity region 20A, thereby also generating common source region 21A for the non-volatile memory cells on each side of the mesa region. In addition, source regions 21B and 21C are formed, each of which will, in turn, serve as a common source region for two spaced apart non-volatile memory cells. Ion implantation is then conducted to introduce a p-type impurity into first impurity region 20A thereby forming impurity regions 52 having a p-type impurity concentration (p), e.g., $1\times10^{13}$ to $1\times10^{15}$ atoms $cm^{-3}$, greater than that of impurity region 200A ($p^-$). Photoresist mask 50 is then removed and the corresponding structure at this stage of the inventive method as viewed along line B–B' is illustrated in FIG. 5B.

Adverting to FIG. 6A, a dielectric layer, i.e. interpoly dielectric layer 60, is then formed on the internal surfaces of through-holes 51 including the exposed surfaces of first and second floating gates 35A, 35B in each trench 31. Interpoly dielectric layer 60 can comprise any of various dielectric materials typically formed between floating gate and control gate electrodes of conventional EEPROs, e.g. a composite stack of silicon oxide/silicon nitride/silicon oxide. Interpoly dielectric layer 60 can also comprise a silicon nitride/silicon oxide/silicon nitride stack, or an oxide, such as tantalum pentoxide ($Ta_2O_5$) or titanium dioxide ($TiO_2$).

After forming the interpoly dielectric layer 60, a second conductive material, e.g., doped polycrystalline (poly 2), is deposited. A metal, such as tungsten, is deposited on poly 2 and annealing is conducted to convert the metal to a metal silicide 62, e.g. tungsten silicide ($WSI_x$ wherein x=1–3). Patterning is then conducted in a conventional manner, forming two control gate electrodes 61 having a tungsten silicide layer 62 thereon. Each control gate electrode 61 comprises a first section 61A filling holes 51 and having a bottom portion in electrical contact with impurity region 52 formed in impurity region 20A, and a second section 61B, integral with first section 61A, extending substantially horizontally with respect to and on the main surface of the substrate.

With continued reference to FIG. 6A, silicon nitride mask 23 is then removed and ion implantation is conducted to introduce n-type impurities forming drain implants 63. In forming the drain implant regions, a desired depth can be obtained by optimizing the implantation dosage and implantation energy for a particular situation. For example, it has been found suitable to implant n-type impurities at a dosage of about $5×10^{14}$ atoms $cm^{-2}$ to about $1×10^{16}$ atoms$^{-2}$ and at an energy of about 1.0 KeV to about 30 KeV, to form a drain region extending to a depth of about 50 A° to about 1,000 A°. The corresponding structure when viewed along line B–B' of FIG. 1 is illustrated in FIG. 6B.

Adverting to FIG. 7A, an oxide layer 70 is deposited. e.g., a silicon oxide layer derived from tetraethyl orthosilicate (TEOS) or silane by plasma enhanced chemical vapor deposition (PECVD), or a high temperature oxide (HTO) derived from silane and vapor deposited at a temperature no less than about 700° C. Etching is then conducted to form through-hole 71, for a bit-line, exposing an upper portion of drain region 63. Through-hole 71 is then filled with a conductive material to form a bit-line, e.g. titanium, cobalt or tungsten (not shown for illustrative convenience). Embodiments include filling through-hole 71 with an initial adhesion promoting titanium nitride layer followed by tungsten, to provide an electrical contact with the drain region. Copper or aluminum can also be deposited in the through-hole to form the contact. Conventional methodology can be employed to deposit or form the metal silicide layer and deposit the dielectric interlayer, form the through-hole and to fill the through-hole with conductive material. The corresponding structure when viewed along line B–B' of FIG. 1 is illustrated in FIG. 7B.

The present invention offers several technological advantages. Adverting to FIG. 7A, region 20C, between channel regions 34 of mesa region 32, advantageously functions as a floating substrate, thereby enabling realization of the advantages of an SOI structure without its usual disadvantages, such as defects. In addition, impurity regions 52 advantageously avoid leakage between adjacent memory cells. Embodiments of the present invention also advantageously enjoy design flexibility, in that the substrate can comprise any of various materials, including resilient or flexible plastics, on which the depicted structure is built. In accordance with the present invention, the area between the control gate and floating gate is advantageously significantly increased, thereby increasing the coupling ratio. The use of a shared source region 21A advantageously enables reduction in the source area, thereby improving erase efficiency. The use of a single control gate for controlling first and second floating gate electrodes 35A and 35B provides additional advantages in reducing the number of word lines, thereby reducing the complexity of the layout and conserving precious real estate. The present invention, therefore, takes a significant step forward in enabling the manufacture of semiconductor devices comprising an array of EPROMs satisfying design rules into the sub micron range, e.g., below about 0.18 microns.

It should be recognized that although the present invention has been illustrated schematically with the use of certain conductivity types, the opposite conductive types can also be implemented. For example, adverting to FIG. 2A, impurity region 20A can be an n-type impurity region, while source layer 21 can be p⁻, and impurity region 20B can be an n⁻ region.

The present invention is capable of providing non-volatile semiconductor devices, such as EEPROM devices, satisfying the ever increasing drive for high density and reduced feature sizes. For example, embodiments of the present invention include forming trenches in a substrate, each trench having a width of about 0.1 microns to about 0.5 microns and extending to a depth of about 0.1 microns to about 0.5 microns. The floating gate electrodes typically have a thickness of about 250 A° to about 2,500 A°. The first section of each control gate electrode extends into the substrate and typically has a thickness of about 500 A° to about 5,000 A°, and extends to a depth of about 500 A° to about 5,000 A°. The second section of the control gate electrode extending on the substrate typically has a thickness of about 500 A° to about 5,000 A°. Semiconductor devices produced in accordance with the present invention have higher floating gate coupling ratios for enhanced device performance, larger tunneling areas for improved efficiency in programming and erasing and low source/drain resistances. Significantly, the semiconductor devices of the present invention are characterized by substantially planar topography at the front and back ends during processing, thereby enabling the use of conventional photolithographic techniques to form fine feature sizes without challenging inherent depth of focus limitations. The present invention provides denser layouts by employing conventional trench isolation in combination with the non-volatile trench devices of the present invention. The semiconductor devices produced in accordance with the present invention are applicable to any of various types of circuitry. Thus, the present invention improves miniaturization, increases operating speed, improves reliability, accuracy, efficiency and the signal-to-noise ratio, enables superior process control and reduces manufacturing costs, thereby providing a competitive advantage. The present invention can be employed in manufacturing various types of semiconductor devices.

The present invention can be practiced by employing conventional materials, methodology and equipment. Accordingly, the details of such materials, equipment and methodology are not set forth herein in detail. The present invention is applicable to the production of various types of semiconductor devices, and enjoys particular utility in the production of semiconductor devices containing flash memory devices and having a design rule less than about 0.18 microns.

In the previous descriptions, numerous specific details are set forth, such as specific materials, dimensions, structures, chemicals, processes, parameters, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concern as expressed herein.

What is claimed is:

1. A semiconductor device comprising:
   a substrate having a main surface; and
   first and second spaced apart double non-volatile memory cells, each double non-volatile memory cell comprising first and second floating gate electrodes spaced apart from a common control gate electrode by a dielectric layer, wherein:
      the common control gate of the first double non-volatile memory cell is spaced apart from the common control gate of the second double non-volatile memory cell;
      the substrate comprises:
         a first impurity region containing an impurity of the first conductivity type at a first impurity concentration;

a common source region, on the first impurity region, comprising an impurity of the second conductivity type, opposite to the first impurity conductivity type; and a mesa region, on the common source region, between the second floating gate of the first double non-volatile memory cell and the first floating gate of the second double non-volatile semiconductor cell and having first and second side surfaces containing an impurity of the first conductivity type at an impurity concentration greater than the first impurity concentration and constituting first and second channel regions separated by a central region comprising an impurity of the first conductivity type at a concentration less than the channel impurity concentration; and each common control gate terminates in an impurity region of the first conductivity type having an impurity concentration greater than the first impurity concentration.

2. The semiconductor device according to claim 1, wherein the first and second floating gates and part of the common control gate of each double non-volatile memory cell extend into the substrate.

3. The semiconductor device according to claim 1, wherein the first impurity region comprises a doped silicon substrate.

4. The semiconductor device according to claim 1, wherein the double non-volatile memory cells are formed in an active region isolated by trenches filled with dielectric material.

5. The semiconductor device according to claim 1, wherein each common control gate terminates below the common source region.

* * * * *